BALANCED FM DETECTOR WITH VARIABLE RESISTANCE LOADS

Filed June 13, 1966

INVENTOR.
Laurel Raymond Lind
BY Pendleton, Neuman,
Seibold & Williams
Attorneys United States Patent Office 3,518,561
Patented June 30, 1970

3,518,561
BALANCED FM DETECTOR WITH VARIABLE RESISTANCE LOADS

Laurel Raymond Lind, Auburn, Ind., assignor to The Magnavox Company, Fort Wayne, Ind., a corporation of Delaware Filed June 13, 1966, Ser. No. 557,102
Int. Cl. H03d 3/10, 3/26; H04b 1/62
U.S. Cl. 329—130 10 Claims

ABSTRACT OF THE DISCLOSURE

A balanced, FM ratio detector is disclosed having a pair of coupled resonant circuits each having means for varying its effective load resistance with changes in the input signal amplitude.

Figure 1:
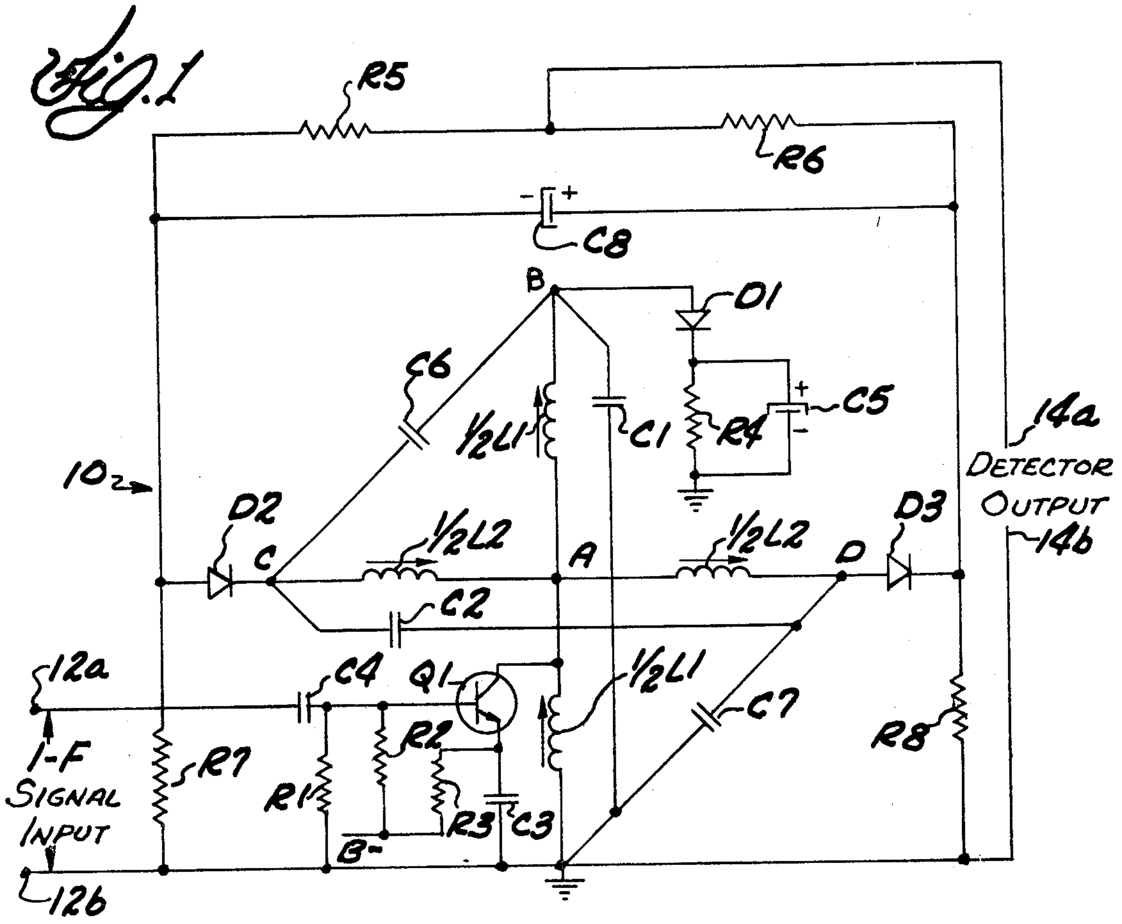

The present invention relates generally to detectors for frequency modulated signals and, more specifically, to a balanced detector for frequency modulated signals which functions as a ratio detector.

Various systems have been used for the detection of frequency modulated signals. Commonly, a phase discriminator or a modified phase discriminator, utilized as a ratio detector, has been used for this purpose. Ratio detectors are desirable in commercial receivers since they do away with the need for additional gain and supplemental limiting of amplitude variations which cause undesirable noise between channels. However, present ratio detectors do not remain balanced under all operating conditions, and unbalanced circuits result in increased amplitude modulation components in the detector outputs which are undesirable.

A primary object of the present invention is to provide a new and improved detector for frequency modulated signals. More specifically, it is an object to provide a detector of this type which functions as a ratio detector.

A further object is to provide a new and improved detector for frequency modulated signals which remains balanced under substantially all operating conditions. Accordingly, it is an object to provide such a detector which limits the production of amplitude modulation components in its output. In this latter connection, it is an object to provide such a detector which increases the rejection of unwanted amplitude modulation components.

A more specific object is to provide a new and improved detector for frequency modulated signals wherein electrical balance is achieved without critical lead adjustment, without selected diodes and without the use of unequal balancing resistors.

A general object is to provide a detector, as set forth above, wherein the components may be placed on a printed circuit board in a balanced arrangement.

Another general object is to provide a new and improved frequency modulated signal detector characterized in its simplicity, economy and stability of operation.

Other objects and advantages of the present invention will become apparent upon reading the attached detailed description taken in conjunction with the drawing.

In one form of the present invention, a frequency modulated signal detector is provided which includes a pair of resonant circuits. A signal input is provided and means are provided for coupling the input to at least a portion of one of the resonant circuits. Additionally, an output is provided, and means are provided for coupling the output to at least a portion of the other resonant circuit. The resonant circuits are capacitively coupled together, and means are associated with each resonant circuit for varying the effective load resistance thereof in the face of changes in amplitude of a signal applied to the input.

Figure 2:
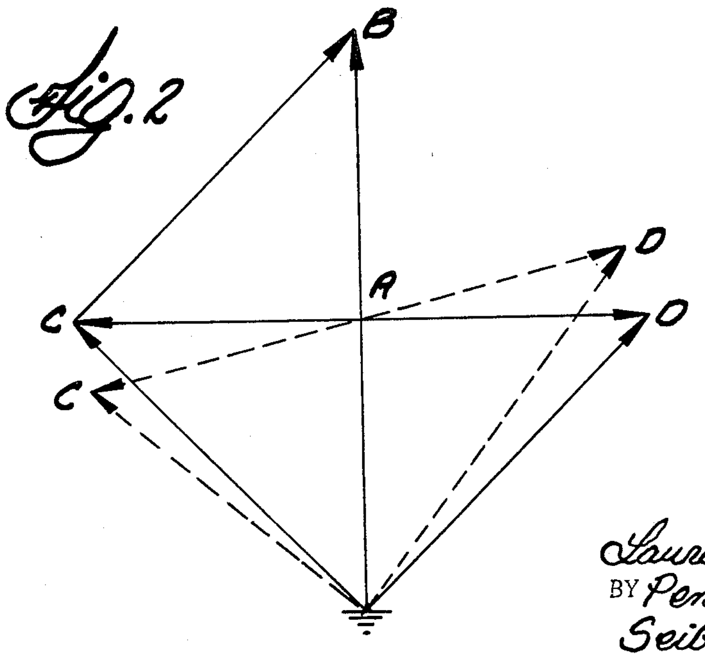

For the purpose of providing a detailed description of a detector constructed in accordance with the teachings of the present invention, reference is made to the drawing wherein:

FIG. 1 is a schematic diagram of a frequency modulated signal detector constructed in accordance with the teachings of the present invention; and FIG. 2 is a vector diagram representing operation of the detector shown in FIG. 1.

While the invention has been shown and will be described in some detail with reference to a particular exemplary embodiment thereof, there is no intention that it be limited to such detail. Quite to the contrary, it is intended here to embrace all modifications, alternatives and equivalents falling within the spirit and scope of the invention as defined by the appended claims.

Referring now to the drawing and more specifically to FIG. 1, a frequency modulated signal detector 10 is shown which is constructed in accordance with the teachings of the present invention and which functions as a ratio detector. As may be seen, the disclosed detector 10 includes a pair of tuned resonant circuits, which in the exemplary arrangement are parallel resonant circuits. A first parallel resonant circuit includes an inductor L1 and a capacitor C1, whereas the second parallel resonant circuit includes an inductor L2 and a capacitor C2. In the exemplary arrangement, center taps of the inductors L1 and L2 are connected together at terminal A so that each inductor is thereby divided into two equal sections. The inductors L1 and L2 may be bifilar wound coils with adjustable cores to allow for slug tuning of the parallel resonant circuits.

Input signals, which have been designated in FIG. 1 as IF input signals, are applied across input terminals 12*a*, 12*b*. The input terminals 12*a* and 12*b* are coupled across one half of the inductor L1 in the first parallel resonant circuit L1, C1 so that the input voltage is stepped up by transformer action and twice the applied voltage appears across the first parallel resonant circuit. In the exemplary arrangement, the input terminals are coupled across the lower half of the inductor L1, as viewed in FIG. 1. For the purpose of coupling the input signal to the lower half of the inductor L1, an amplifier network is provided which includes a transistor Q1. As may be seen, the collector of the transistor Q1 is coupled directly to the upper end of the lower half of the inductor L1, whereas the emitter is coupled to the lower end thereof through a capacitor C3 and the base is coupled to the input 12*a* through a capacitor C4. The input 12*b* and the lower end of the lower half of the inductor L1 are connected directly to ground. Additionally, the base of the transistor Q1 is connected to ground through a resistor R1 and both the base and the emitter of the transistor are respectively connected to a biasing potential B− through resistors R2 and R3. This amplifying network functions to amplify the IF signal applied to input terminals 12*a*, 12*b* and supplies the amplified signal across the lower half of the inductor L1.

A detector output signal is developed across output terminals 14*a*, 14*b*. The output terminals 14*a*, 14*b* are coupled to the detector 10 so that an output signal is developed thereacross which is representative of the frequency of the voltage applied to the input terminals 12a, 12b. In the exemplary arrangement, the terminal 14b is connected directly to ground, whereas the terminal 14a is connected to the junction of a pair of output resistors R5 and R6. The opposite ends of the output resistors R5 and R6 are respectively coupled to opposite terminals C, D of the second parallel resonant circuit L2, C2 through respective diodes D2 and D3. Additionally, terminal C is coupled to ground through the diode D2, and an output control resistor R7 and terminal D is coupled to ground through the diode D3 and an output control resistor R8. With this arrangement, rectified voltages of opposite polarities are developed across the output control resistors R7 and R8, and the opposite polarity voltages are combined through the output resistors R5 and R6 so that a resultant output is developed between output terminals 14a and 14b which is equal to the difference in amplitudes between the voltages developed across the resistors R7 and R8. The difference in amplitudes between the voltages developed across resistors R7 and R8 is dependent upon the frequency of the input signal applied to input terminals 12a, 12b.

In accordance with one aspect of the present invention, means are provided for varying the effective load resistance of the first parallel resonant circuit L1, C1, in the face of input voltage amplitude changes, to suppress undesired amplitude modulation. In the exemplary arrangement, the first parallel resonant circuit L1, C1 is loaded by a first loading circuit which includes a diode D1 connected in series with the parallel arrangement of a resistor R4 and a capacitor C5. As may be seen, the loading circuit is connected in parallel with the first parallel resonant circuit. The loading circuit functions to load the first parallel resonant circuit and to vary the effective load resistance of the first parallel resonant circuit in the face of input voltage amplitude changes to suppress undesired amplitude modulation.

A brief description of the operation of the first loading circuit may be helpful in understanding the present invention. When the amplitude of the voltage applied to the first resonant circuit is constant, current flows through the diode D1 in the loading circuit and the current flow becomes stable when a prescribed plus-minus charge is attained on the capacitor C5, as illustrated. When the voltage applied to the first resonant circuit increases in amplitude, the current flow through the diode D1 increases correspondingly. This increase in the current flows into the capacitor C5. The capacitor C5 is selected to have a large capacity so that the capacitor C5 functions to attempt to keep the voltage across it constant. Accordingly, by Ohm's law ($R=E/I$), when the current flow increases and the voltage remains substantially constant, the resistance decreases. This decreases the effective diode load resistance, when the amplitude of the voltage applied to the first parallel resonant circuit increases, and causes the first parallel resonant circuit to be more heavily loaded than when the voltage applied thereto is constant. This increased loading of the first parallel resonant circuit load resistance, when the amplitude of the voltage applied thereto.

On the other hand, when the amplitude of the voltage applied to the first parallel resonant circuit L1, C1 decreases, the current flow through the diode 1 decreases correspondingly and the capacitor C5 again functions to attempt to keep the voltage across it constant. When the current flow decreases and the voltage remains substantially constant, the resistance increases. This increases the effective diode load resistance, when the amplitude of the voltage applied to the first parallel resonant circuit decreases, and causes the first parallel resonant circuit to be less heavily loaded than when the voltage applied thereto is constant. This decreased loading of the first parallel resonant circuit partially represses the decrease in the voltage applied thereto.

Thus, it will be seen that the loading circuit functions to vary the effective load resistance of the first resonant circuit, in the face of instantaneous input voltage changes, so as to partially repress changes in the amplitude of the voltage applied to the first parallel resonant circuit which results in partial suppression of undesired amplitude modulation.

In keeping with present invention, the second parallel resonant circuit L2, C2 is capacitively coupled to the first parallel resonant circuit L1, C1. In the exemplary arrangement, the parallel resonant circuits are top and bottom coupled by a pair of equal capacitors C6 and C7. Accordingly, the upper terminal B of the first parallel resonant circuit is coupled by capacitor C6 to the left-hand terminal C of the second parallel resonant circuit, whereas the lower or grounded terminal of the first parallel resonant circuit is coupled by capacitor C7 to the right-hand terminal D of the second parallel resonant circuit. With this arrangement, the voltage developed across the second parallel resonant circuit, at resonance, is shifted 90° in phase from the voltage developed across the first parallel resonant circuit. This relationship at resonance is shown in the vector diagram of FIG. 2 by the solid lines. As may be seen, the voltages developed between ground and the end terminals C and D of the second parallel resonant circuit, i.e., the voltages developed across resistors R7 and R8, are equal under these conditions. The voltages are rectified by diodes D2 and D3 so that opposite polarity voltages are developed across the resistors R7 and R8.

When the frequency of the voltage applied between ground and terminal A, i.e., across the lower half of the inductor L1, varies from resonant frequency, the phase angle between the voltage developed across the first parallel resonant circuit and the voltage developed across the second parallel resonant circuit changes from that at resonance, assuming that input signal has a constant magnitude. Such a change in the phase angle between the voltages developed across the first and second parallel resonant circuits is illustrated in FIG. 2 by a comparison of the dotted line showing of the voltage developed between terminals C and D and the solid line showing of the voltage developed between ground and terminal B. As may be seen, this results in changes in the relative magnitudes of the voltages developed between ground and the respective end terminals C and D of the second parallel resonant circuit, i.e., the voltages developed across the resistors R7 and R8. These voltages are rectified by the diodes D2 and D3 so that opposite polarity voltages are developed across the resistors R7 and R8.

In view of the foregoing, it will be seen that, when the frequency of the voltage applied to the first parallel resonant circuit is at resonance, equal magnitude and opposite polarity voltages are developed across the resistors R7 and R8 so that a zero resultant output voltage is developed between output terminals 14a, 14b. On the other hand, when the frequency of the voltage applied to the first parallel resonant circuit shifts from that at resonance, voltages are developed across the resistors R7 and R8 which are unequal in magnitudes and opposite in polarities. Accordingly, under these latter circumstances, a resultant output voltage is developed between output terminals 14a, 14b which is representative of the change in frequency of the input voltage applied to input terminals 12a, 12b.

In further keeping with the present invention, means are provided for varying the effective load resistance of the second parallel resonant circuit L2, C2 in the face of changes in the amplitude of a signal applied to the detector input. For this purpose, a capacitor C8 is connected in parallel with resistors R5 and R6 to load the second parallel resonant circuit. When the sum of the opposite polarity voltages developed between ground and the terminals C and D is constant, i.e., developed across resistors R7 and R8, a charge is attained on the capacitor C8 and the current flowing through the diodes D2 and D3 becomes stable when a prescribed charge is attained on the capacitor C8.

As the sum of the voltages developed across the resistors R7 and R8 increases, the current flowing through the diodes D2 and D3 increases correspondingly and this current flows into the capacitor C8. The capacitor C8 is selected to have a large capacity so that it attempts to keep the voltage across it constant. Accordingly, as the current flow increases and the voltage remains substantially constant, the resistance decreases. This decreases the effective load resistance, when the signal amplitude increases, and causes the second parallel resonant circuit to become more heavily loaded than when the sum of the voltages developed across resistors R7 and R8 is constant. This increased loading of the second parallel resonant circuit partially represses the increase in the sum of the voltages.

On the other hand, when the sum of the voltages developed across resistors R7 and R8 decreases, the current flow through diodes D2 and D3 decreases correspondingly. The capacitor C8 again attempts to keep the voltage across it constant. When the current decreases and the voltage remains substantially constant, the resistance increases. This increases the effective diode load resistance, when the signal amplitude increases, and causes the second parallel resonant circuit to be less heavily loaded, and this decreased loading partially represses the decrease in the sum of the voltages.

Thus it will be seen that the capacitor C8 functions to vary the effective load resistance of the second parallel resonant circuit, in the face of instantaneous voltage changes, so as to repress changes in voltage amplitude which results in partial suppression of undesired amplitude modulation. The variations of the effective load resistances of both the first and second parallel resonant circuits results in almost complete suppression of undesired amplitude modulation.

In view of the foregoing, it will be seen that a new and improved frequency modulator signal detector has been provided. The capacitive coupling between the first and second parallel resonant circuits has proved to be more desirable than inductive coupling between such a circuit. Such capacitive coupling provides for greater flexibility when molded coils are used, and correct coupling is easier to obtain without circuit unbalance. On the other hand, when inductive coupling is used with slug tuning, the core positions affect the coupling and correct coupling is difficult to obtain without circuit unbalance. Moreover, it has been found that, with capacitive coupling, the circuit is more likely to remain balanced under all operating conditions. This is true since there is less detuning of the tuned resonant circuits with signal level changes when capacitive coupling is utilized than when inductive coupling is utilized. The capacitances of semiconductive diodes vary with applied voltage and operating temperature. When inductive coupling is utilized, the capacitances of the diodes form a substantial part of the tuning capacitances and such variations of the capacitances of the semiconductive diodes result in detuning of the tuned circuits and circuit unbalance. However, with the circuit constructed in accordance with the teachings of the present invention, large capacitors are preferably utilized in the tuned circuits and no grounded RF bypass capacitors are provided at the diode loads so that the diode capacities are very small parts of the tuning capacitances and changes therein have little effect on the tuned circuits. Accordingly, the circuit constructed in accordance with the present invention remains balanced under substantially all operating conditions.

Finally, electrical balance is achieved with the present circuit without critical lead adjustment, without selected diodes and without the use of unequal balancing resistors.

Electrical balance is a result of the balanced arrangement of the parts that is possible with a circuit. With the present circuit, stray capacity has little effect since large capacitors are utilized in the tuned circuits. Moreover, large wire may be used in the bifilar wound coils and the coils may be molded in plastic with all four coil sections being virtually identical. Finally, the length of all leads that must be balanced can be made identical. The foregoing results from the use of capacitive coupling in lieu of inductive coupling.

In a typical circuit constructed in accordance with the teachings of the present invention, the component values are as follows:

| | |
|---|---|
| R1—12,000 ohms | C1—200 picofarads |
| R2—4,700 ohms | C2—200 picofarads |
| R3—220 ohms | C3—10,000 picofarads |
| R4—10,000 ohms | C4—10,000 picofarads |
| R5—4,700 ohms | C5—5 microfarads |
| R6—4,700 ohms | C6—12 picofarads |
| R7—4,700 ohms | C7—12 picofarads |
| R8—4,700 ohms | C8—5 microfarads |

L1 and L2—Bifilar wound coils with adjustable cores (7¼ turns, with two strands of No. 22 wire on a ¼-inch form)

D1, D2, and D3—Germanium diodes, Magnavox No. 530092–1

Q1—Silicon Transistor, Magnavox No. 610041–2

What is claimed is:

1. In a frequency modulated signal detector, the combination which comprises a signal input, a pair of tuned resonant circuits each having an effective load resistance, means for coupling the input to at least a portion of one of the resonant circuits, means for coupling the resonant circuits, means electrically coupled to each of the resonant circuits, for varying the effective load resistance thereof in the face of a change in amplitude of a signal applied to the input, an output, and means for coupling the output to at least a portion of the other resonant circuit.

2. The detector as recited in claim 1 wherein the resonant circuits include inductive elements having adjustable cores and having connected center taps.

3. The detector as recited in claim 1 wherein said means for coupling is capacitive.

4. The detector as recited in claim 3 wherein the capacitive coupling means capacitively couples the ends of one of said pair of tuned resonant circuits with the ends of the other of said pair of tuned resonant circuits.

5. The detector as recited in claim 1 wherein the load varying means are in the form of capacitive networks.

6. The detector as recited in claim 2 wherein the input is coupled across one-half of the inductive element in the one resonant circuit.

7. The detector as recited in claim 2 wherein the output is coupled across the entire inductive element in the other resonant circuit.

8. The detector as recited in claim 7 wherein rectifying means are associated with each half of the inductive element in the other resonant circuit.

9. In a frequency modulated signal detector, the combination which comprises a signal input, a pair of resonant circuits each including an inductive element shunted by a capacitive element and each having an effective load resistance, the inductive elements having connected center taps, means for coupling the input across one-half of the inductive element in one of the resonant circuits, means for capacitively coupling the ends of one of said pair of tuned resonant circuits with the ends of the other of said pair of tuned resonant circuits, capacitive means electrically coupled to each of the resonant circuits for varying the effective load resistance thereof in the face of changes in amplitude of the signal applied to the input, an output, and means including a diode and output resistors coupled to each half of the inductive element in the other resonant circuit for connecting the output across the inductive element.

10. In a frequency modulated signal detector, the combination which comprises a signal input, a pair of resonant circuits each having an effective load resistance, means for coupling the input to at least a portion of one of the resonant circuits, means for coupling the resonant circuits, means electrically coupled to each resonant circuit for varying the effective load resistance in the face of a change in amplitude of a signal applied to the input, an output, and means for coupling the output to at least a portion of the other resonant circuit.

References Cited

UNITED STATES PATENTS 2,511,448 6/1950 Seeley ---------- 329—138 X

FOREIGN PATENTS 92,260 11/1961 Denmark.

ALFRED L. BRODY, Primary Examiner

U.S. Cl. X.R.

329—143; 307—233, 237; 325—347